United States Patent
Shi et al.

(10) Patent No.: US 12,388,434 B2
(45) Date of Patent: Aug. 12, 2025

(54) NEGATIVE BIAS CIRCUIT FOR POWER DEVICE DRIVING

(71) Applicant: Rivian IP Holdings, LLC, Plymouth, MI (US)

(72) Inventors: Yuxiang Shi, Cary, NC (US); Muhammad Mobeen Mahmood, Irving, TX (US); Prashanth Morkonda Umachandran, Long Beach, CA (US); Steven Schulz, Torrance, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 1 day.

(21) Appl. No.: 18/121,528

(22) Filed: Mar. 14, 2023

(65) Prior Publication Data

US 2024/0313757 A1    Sep. 19, 2024

(51) Int. Cl.
| | |
|---|---|
| *H03K 17/06* | (2006.01) |
| *H03K 17/16* | (2006.01) |
| *H03K 17/687* | (2006.01) |
| *H03K 17/693* | (2006.01) |

(52) U.S. Cl.
CPC ......... *H03K 17/063* (2013.01); *H03K 17/162* (2013.01); *H03K 17/6871* (2013.01); *H03K 17/693* (2013.01)

(58) Field of Classification Search
None
See application file for complete search history.

(56) References Cited

U.S. PATENT DOCUMENTS

| | | | |
|---|---|---|---|
| 6,094,087 A * | 7/2000 | He | H03K 17/04123 327/434 |
| 10,530,357 B1 * | 1/2020 | Kanawati | H10D 64/519 |
| 11,923,832 B1 * | 3/2024 | Xu | H03K 17/063 |
| 2007/0035481 A1 * | 2/2007 | Kim | G09G 3/296 345/68 |
| 2010/0243606 A1 * | 9/2010 | Koshimizu | H01J 37/32091 156/345.44 |
| 2016/0352321 A1 * | 12/2016 | Yamaguchi | H10D 8/25 |
| 2018/0013413 A1 * | 1/2018 | Chuang | H03K 17/041 |
| 2019/0254135 A1 * | 8/2019 | Miyake | H05B 47/20 |
| 2021/0057980 A1 * | 2/2021 | Shiomi | H02M 3/1588 |

OTHER PUBLICATIONS

Texas Instruments, "UCC21540-Q1 Reinforced Isolation Dual-Channel Gate Driver," revised Feb. 2021, 44 pages.

\* cited by examiner

*Primary Examiner* — Sibin Chen
(74) *Attorney, Agent, or Firm* — BAKERHOSTETLER

(57) ABSTRACT

Aspects of the disclosure relate to a negative bias circuit for power device driving. An apparatus may include a power source, a gate impedance path, a capacitor in series with the gate impedance path, and a clamping circuit for a transistor gate.

20 Claims, 7 Drawing Sheets

NEGATIVE BIAS CIRCUIT FOR POWER DEVICE DRIVING

INTRODUCTION

A gate driver is a power amplifier that accepts a low-power input from a controller integrated circuit and produces a high-current drive input for the gate of a high-power transistor such as an insulated-gate bipolar transistor (IGBT) or power metal-oxide-semiconductor field-effect transistor (MOSFET).

MOSFET (metal-oxide-semiconductor field-effect transistor) may be a component in power conversion and switching circuits for such applications as motor drives and switch-mode power supplies (SMPSs). Current flowing through the channel between the source and drain is controlled by the gate voltage.

Aspects of the subject technology can help to improve the overall cost, reliability, and efficiency of circuits.

SUMMARY

The present description is generally directed to a negative bias circuit for power device driving. Silicon Carbide (SiC) metal-oxide semiconductor field-effect transistors (MOSFETs) may use negative voltage driving for better noise immunity as well as long-term reliability. Without such mechanisms there may be damage due to overheating caused by short circuit due to false turn on of Field Effect Transistors (FETs) in a bridge. The disclosed subject matter integrates a capacitor in combination with a clamping circuit in the driving loop, which may address overvoltage gate damage at start-up, as well as increase the occasions to charge the capacitor and therefore minimize the time to stabilize negative bias.

In accordance with one or more aspects of the disclosure, an apparatus for power device driving is provided. The apparatus may include a totem pole driver; a gate impedance path of a gate driver loop path, wherein the totem pole driver is connected with the gate impedance path; a capacitor in series with the gate impedance paths of the gate driver loop path; and a clamping circuit of the gate driver loop path. The clamping circuit may clamp voltage of a transistor gate and the clamping circuit may include a plurality of Zener diodes in back-to-back series arrangement. The totem pole driver may be a unipolar driver. A unipolar driver may include a Negative-Positive-Negative type (NPN) transistor or a Positive-Negative-Positive type (PNP) transistor or any other combination of switches, such as MOSFETs, to create the unipolar drive. The capacitor may be positioned between the power source and the gate impedance path. The series capacitor may block some DC voltage by acting as a voltage divider with the FET gate-source capacitance. This may shift the unipolar pulses to bipolar to create a positive $V_{gs}$ for turn on and negative $V_{gs}$ for turn off of the FET.

In one or more implementations, the clamping circuit may be positioned between the totem pole driver and the gate impedance path, or between a gate impedance path and the transistor gate. The transistor gate may include a SiC MOSFET, N-channel MOSFET, gallium nitride (GaN) transistor, IGBT, or any other switch that may use negative bias.

In one or more implementations, the gate impedance path may include a first path that includes an on resistor and a second path in parallel with the first path, wherein the second path includes an off resistor in series with a diode.

In one or more implementations, the apparatus may include a gate driver loop path comprising a power source, a gate impedance, a capacitor in series with the gate impedance, and a clamping circuit for a transistor gate.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more other implementations. In one or more implementations, structures and components are shown in block diagram form in order to avoid obscuring the concepts of the subject technology.

Figure 1:
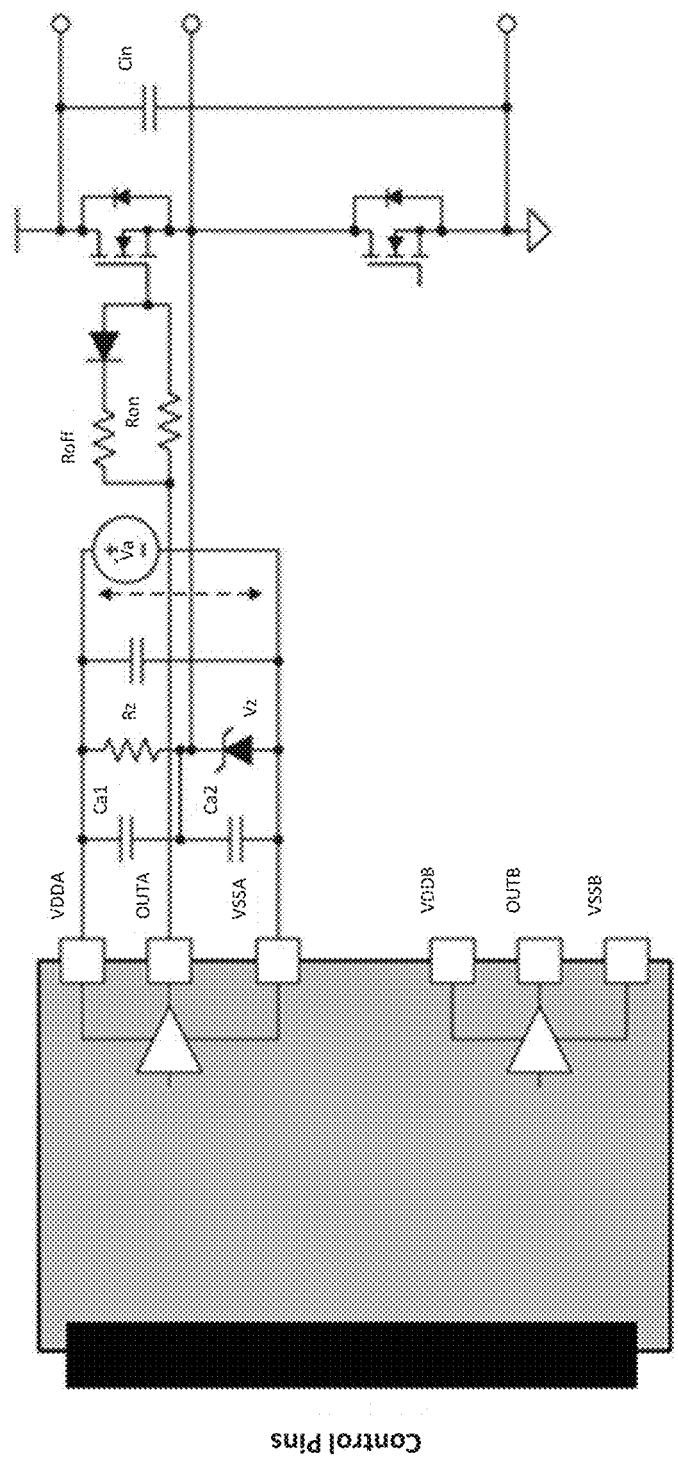
FIG. 1 illustrates an exemplary circuit diagram of negative bias with Zener diode on iso-bias power supply output.

SiC MOSFETs may require negative voltage driving for better noise immunity as well as long-term reliability. Other approaches may be costly or may not satisfy performance targets. FIG. 1 illustrates an exemplary circuit diagram of a circuit with a bipolar bias supply. The configuration of FIG. 1 requires two bias power supplies, one for high side FET and one for low side FET to drive one half bridge. As shown in FIG. 1, the circuit uses two power supplies (or single-input-double-output power supply). $V_A$-$V_z$ determine the turn on voltage. $V_z$ is the Zener clamp voltage. $V_z$ determines the turn-off voltage. This approach may require multiple power supplies and increased cost.

Figure 2:
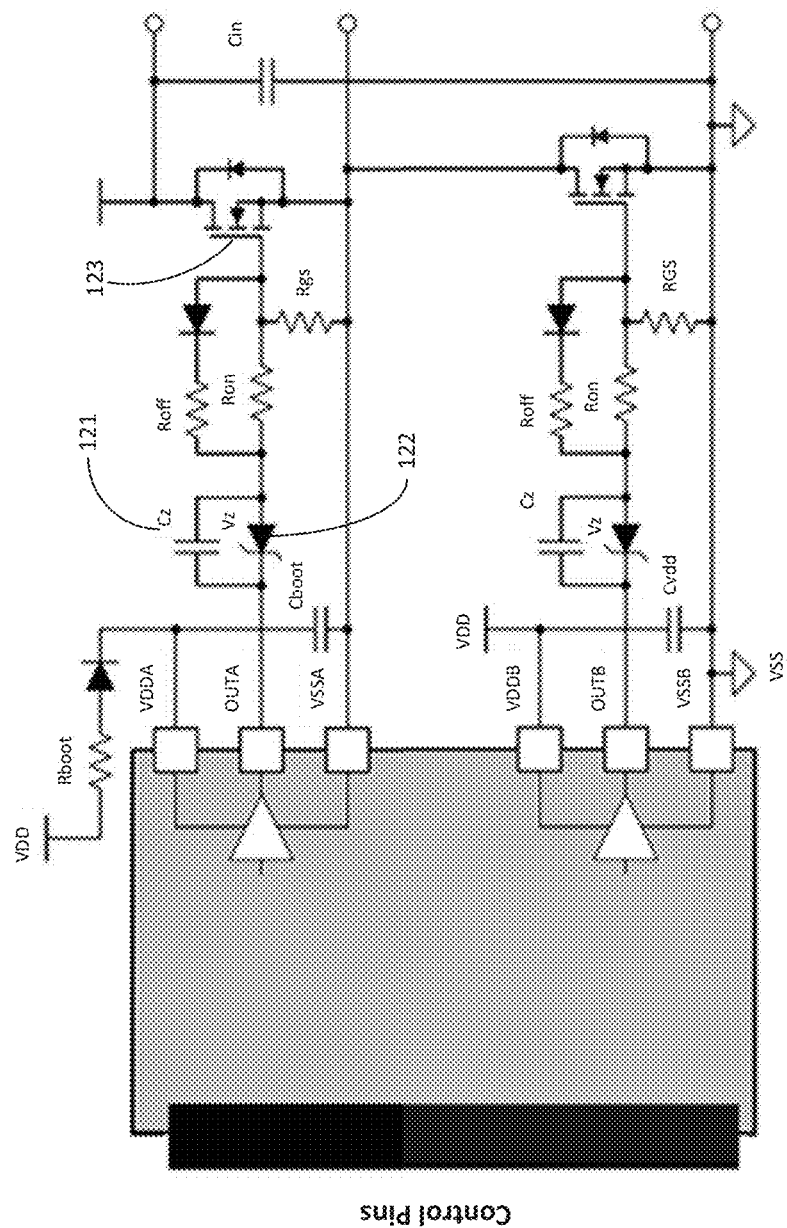
FIG. 2 illustrates an exemplary circuit diagram of negative voltage for bootstrap bias.

FIG. 2 illustrates an exemplary circuit with negative voltage for bootstrap bias. Bootstrapping uses one bias power supply for driving both high side and low side of one half bridge. A negative bias may be generated for bootstrap bias using Zener diode 122. The negative bias voltage level is largely impacted by the device's voltage drop under different operation conditions. Moreover, negative bias voltage of the circuit of FIG. 2 may be built-up slowly as capacitor 121 is only charged during the turn-on switching transient, as disclosed in more detail herein. The circuit of FIG. 2 may carry chance of false turning-on due to low noise immunity at start-up or gate-source overvoltage damage at start-up on the transistor gate since the voltage gap on the negative bias will be added to the positive bias.

Figure 3A:
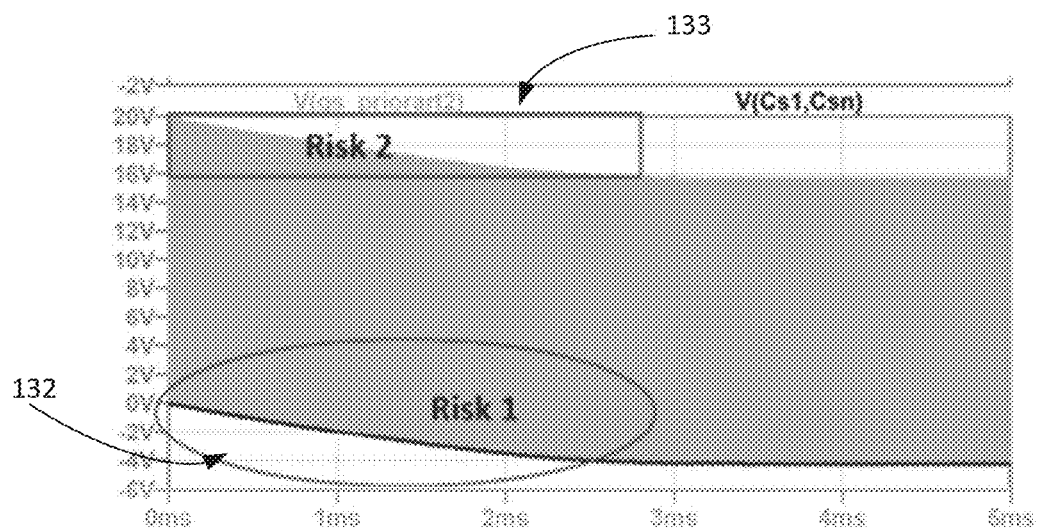
FIG. 3A illustrates an exemplary graph of the gate-source voltages over time for the circuit of FIG. 2.
Figure 3B:
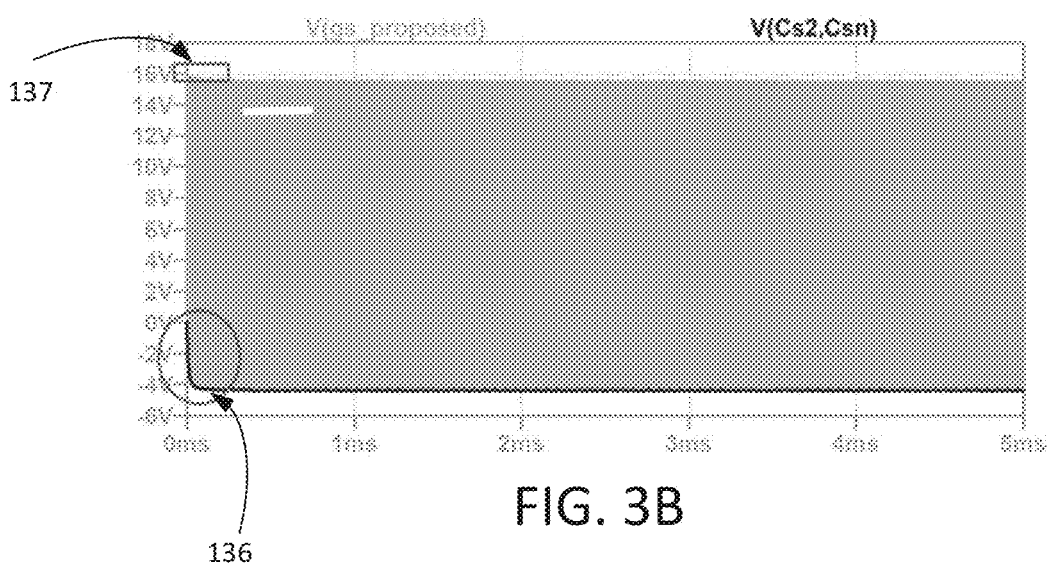
FIG. 3B illustrates an exemplary graph of the gate-source voltages over time for the circuit of FIG. 4B.

In a circuit such as that of FIG. 2 has the build-up on capacitor 121 may be relatively slow when capacitor 121 can only be charged during the turn-on transient, which may be a small percentage of the time of the total ON time (e.g., less than 5% of the ON time). FIG. 3A and FIG. 3B illustrate exemplary graphs of the voltages over time in respective circuits in FIG. 2 and FIG. 4B. As shown in FIG. 3A, area 132 highlights that the charge build-up of capacitor 121 may take over 2.5 milliseconds and area 133 highlights the drop in voltage of transistor gate 123 to 16V may take over 2.5 milliseconds. This rate of capacitor build-up may lead to false turning-on due to low noise immunity and the voltage across transistor gate 123 may lead to overvoltage transistor gate damage. The performance of the circuit of FIG. 4B may differ from the performance of the circuit of FIG. 2, as shown in FIG. 3B. For example, the build-up of capacitor 107 as shown in area 136 and the voltage of transistor gate 111 obtain the preferred levels relatively immediately (e.g., <50 microseconds). Although FIG. 4B is used as an example, FIG. 4A, FIG. 4C, and FIG. 4D have circuits that operate and a similar manner with similar results.

FIG. 4A-FIG. 4D illustrate exemplary circuit diagrams of circuits that may incorporate negative bias for power device driving. As further described herein, negative voltage driving may be used in a manner that integrates a clamping circuit in the driving loop.

Figure 4A:
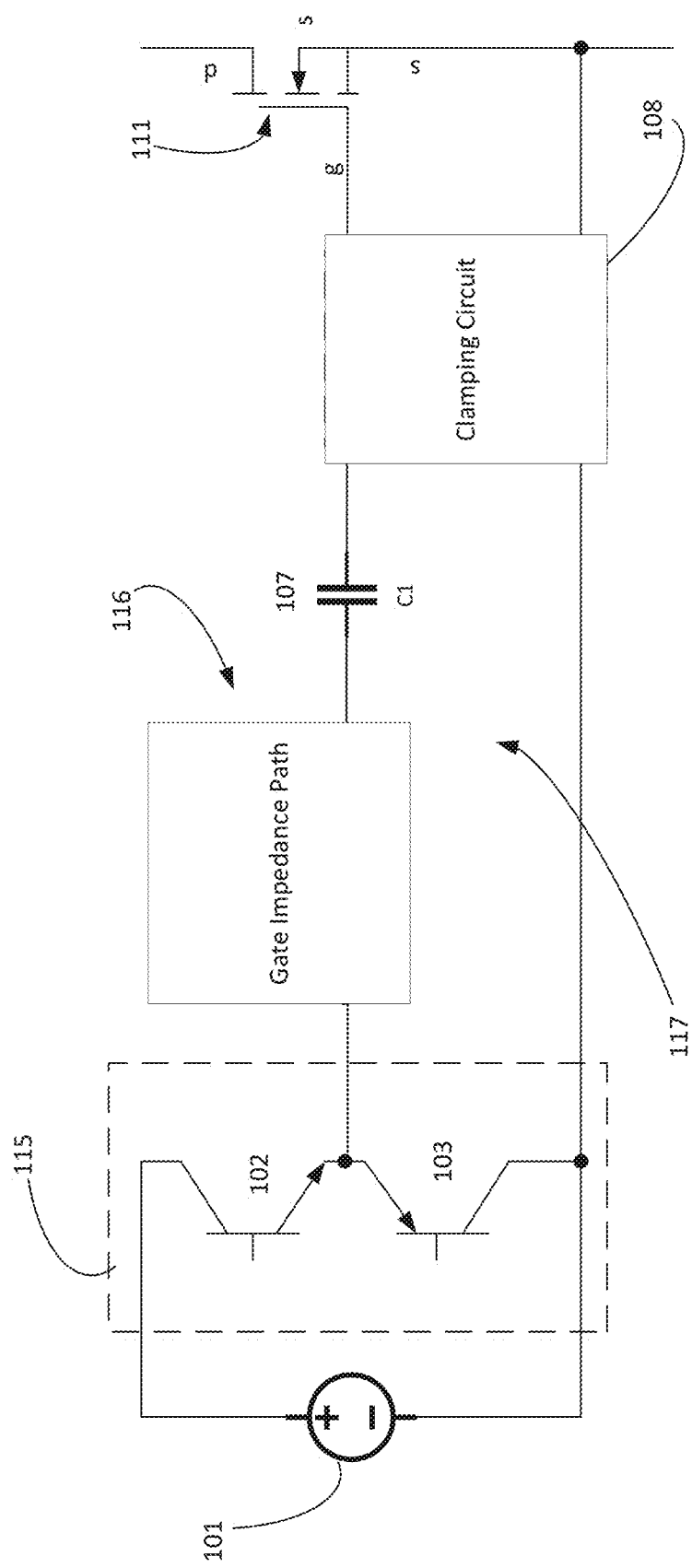
FIG. 4A illustrates a second example of a circuit diagram of a negative bias circuit for power device driving.
Figure 4B:
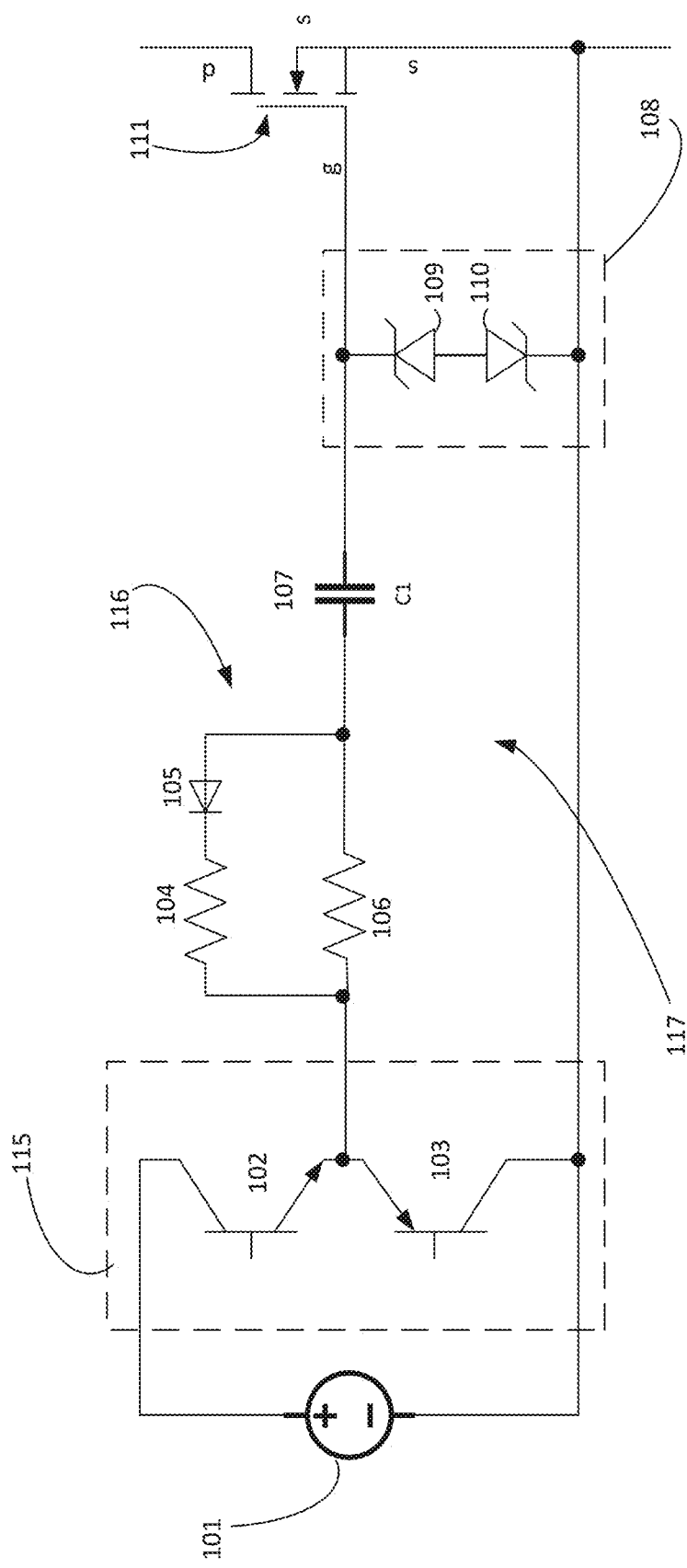
FIG. 4B illustrates a second example a circuit diagram of a negative bias circuit for power device driving.

As shown in FIG. 4A, gate diver loop path 117 may include power source 101, totem pole gate driver 115 (e.g., unipolar driver), gate impedance path 116, capacitor 107, clamping circuit 108, and transistor gate 111 (e.g., n-channel MOSFET, SiC MOSFET, gallium nitride (GaN) transistor, or IGBT). Gate impedance path 116 may include one or more resistors or diodes, such as resistor 104, resistor 106, or diode 105. As shown in FIG. 4A, gate impedance path 116 may include a first path with resistor 106 and a second path in parallel with the first path. The second path may include off resistor 104 in series with diode 105.

Clamping circuit 108 is generally a circuit that fixes the positive or the negative peak excursions of a signal to a defined voltage. Clamping circuit 108 as described herein may incorporate a negative bias, and may include one or more diodes, one or more Zener Diodes (e.g., Zener diode 109 or Zener diode 110 of FIG. 4B-FIG. 4D), resistors, or capacitors, among other things. A negative biased clamping circuit may have an output voltage offset in the negative direction by the bias amount. Clamping circuit 108 may significantly minimize the risk of overvoltage gate damage for a transistor gate, such as transistor gate 111, when configured to clamp the gate voltage to within a threshold (e.g., a voltage rating or operating range) that avoids damage to transistor gate 111. The device's driving voltages (e.g., power source 101) and the maximum gate-source voltage rating of transistor gate 111 should be considered when configuring clamping circuit 108. Series impedance in gate diver loop path 117 may also be considered when considering clamping circuit.

As disclosed herein, the circuits of FIG. 4A-FIG. 4D may reduce the time for transistor gate 111 and negative bias to achieve a preferred voltage when compared to other circuit configurations. Referring to FIG. 4B as an example, the voltage is clamped at 15V based on clamping circuit 108. If power source 101 is 20V and turn on voltage is 15V, turn off voltage should be −5V, there will be 5V dropped across the series resistors (e.g., gate impedance path 116) and capacitor 107, which creates a charging current that allows for capacitor 107 to be charged at substantially all of the ON time. Most of this voltage drop may be across capacitor 107.

Clamping circuit 108 may be positioned near transistor gate 111 to improve performance, but it is contemplated that the positions of clamping circuit 108 and other components (e.g., capacitor 107) may vary in their position as shown in FIG. 4A-FIG. 4D. FIG. 4B illustrates an exemplary circuit diagram that includes a negative bias forming capacitor (e.g., capacitor 107) in the gate driver loop path 117 with back-to-back series arrangement Zener diodes pair (e.g., Zener diode 109 and Zener diode 110) connected to transistor gate 111 and source pins. Zener diode 109 and Zener diode 110 may be selected according to the device's driving voltages to provide turn-on (positive) and turn-off (negative) $V_{gs}$ voltage clamp. Capacitor 107 is designed to provide stable negative bias as well as minimal charging time. As shown, Zener diode 109 and Zener diode 110 clamps transistor gate voltage, which significantly reduces the likelihood of transistor gate damage. Capacitor 107 is charged during the entire on-state of the device; therefore, the negative voltage can be built-up relatively quickly.

Figure 4C:
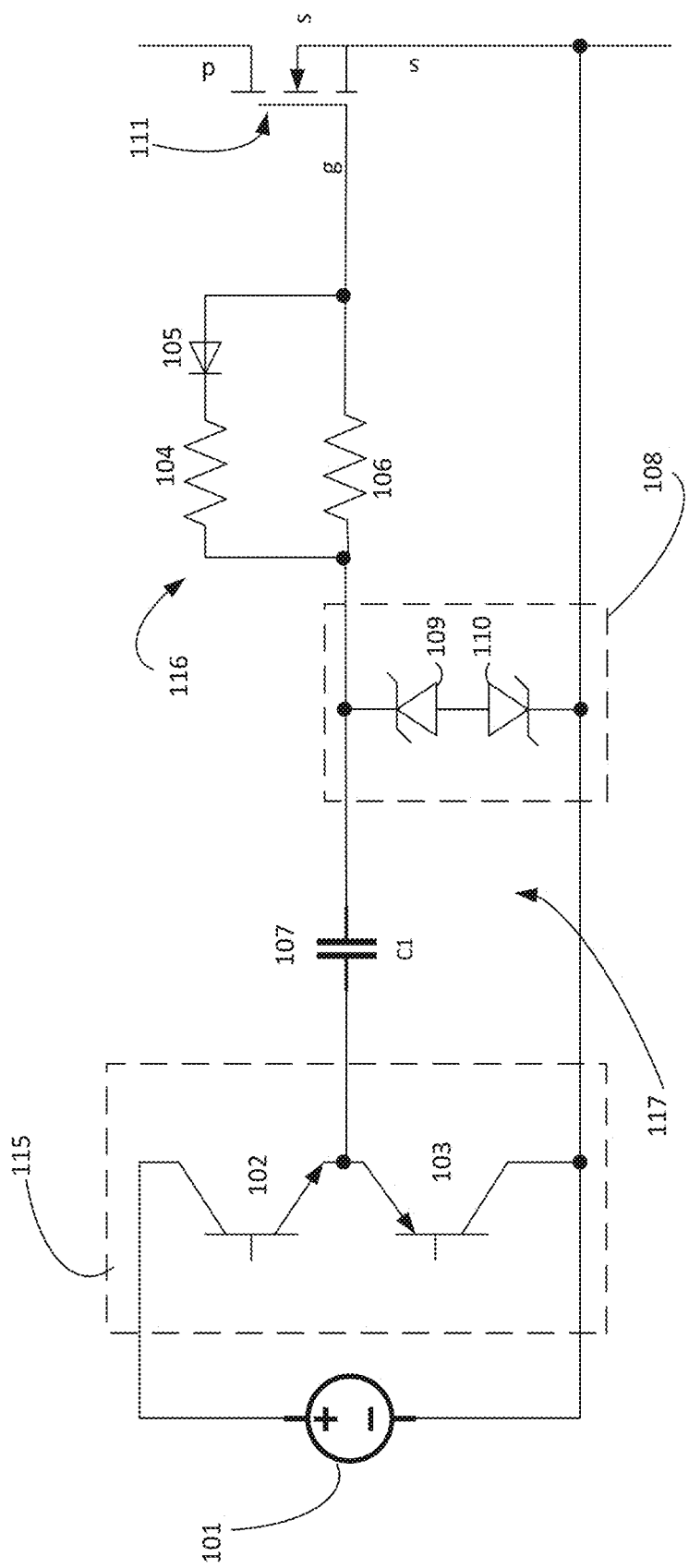
FIG. 4C illustrates a third example of a circuit diagram of a negative bias circuit for power device driving.

FIG. 4C illustrates an exemplary circuit diagram in which clamping circuit 108 may be positioned between totem pole driver 115 and gate impedance path 116. Capacitor 107 remains positioned to provide stable negative bias as well as minimal charging time. Clamping circuit 108 in this configuration is between capacitor 107 and the gate impedance path 116.

Figure 4D:
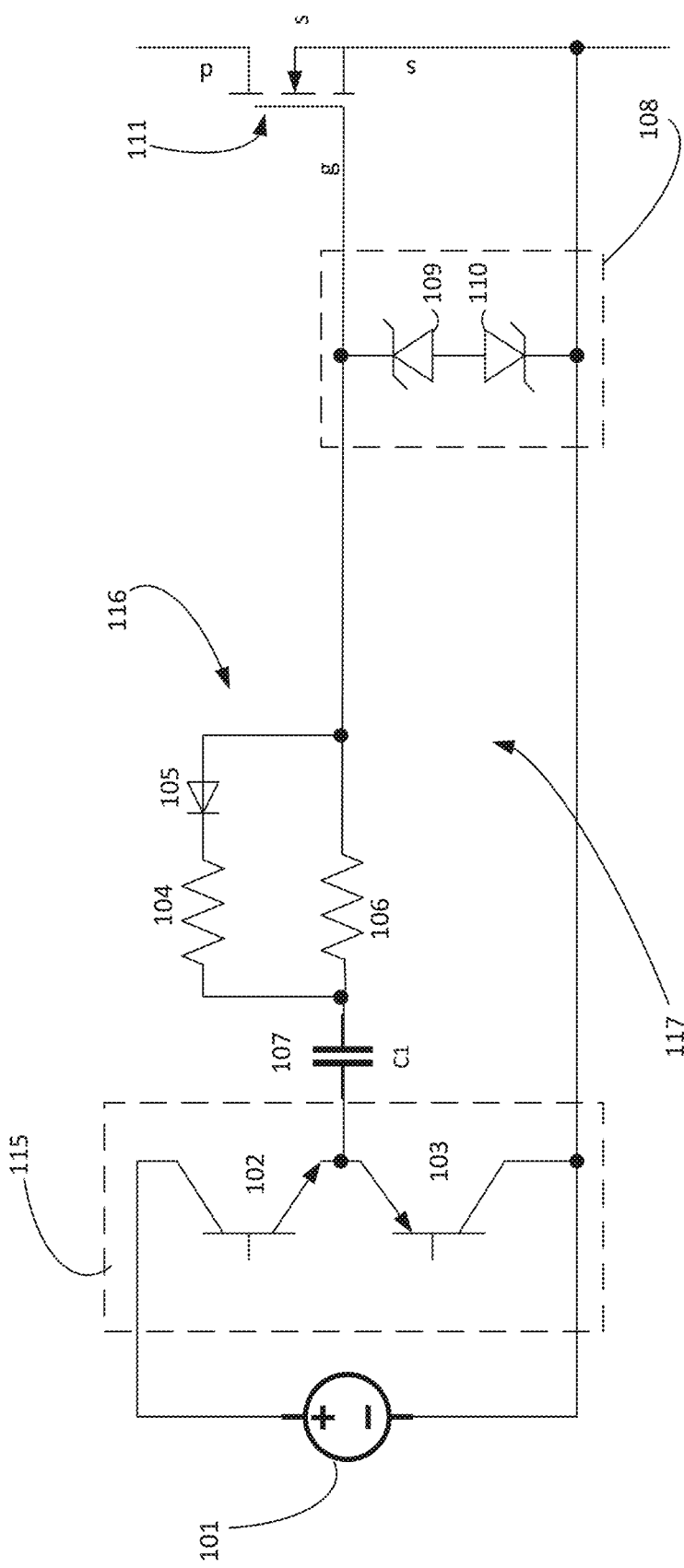
FIG. 4D illustrates a fourth example of a circuit diagram of a negative bias circuit for power device driving.

FIG. 4D illustrates an exemplary circuit diagram in which capacitor 107 may be positioned between power source 101 or totem pole driver 115 and gate impedance path 116 and clamping circuit 108 is positioned between gate impedance path 116 and transistor gate 111.

The disclosed subject matter (e.g., FIG. 4A-FIG. 4D) may be used in automotive power electronics products, such as products that uses wide band gap semiconductor FETs requiring negative bias to avoid self-turn on. Example products may include an on-board charger (OBC), DC-DC converter, or electronic inverter, among other things, which may be integrated into automobiles, such as electric vehicles. High power electronics that use wideband gap semiconductor may incorporate the disclosed negative gate bias driving circuit.

Methods, systems, and apparatuses, among other things, as described herein may provide for negative bias for power device driving. For example, a system may include a totem pole driver; a gate impedance path; a capacitor in series with the gate impedance path; and a clamping circuit. The clamping circuit may clamp voltage of a transistor gate. The clamping circuit may include a plurality of Zener diodes in back-to-back series arrangement (e.g., anti-series). The clamping circuit may be positioned between the totem pole driver or power source and the gate impedance path. The clamping circuit may be positioned between the gate impedance path and the transistor gate. The transistor gate may include a silicon carbide (SiC) metal-oxide-semiconductor field-effect transistor (MOSFET), a n-channel metal-oxide-semiconductor field-effect transistor (MOSFET), gallium nitride (GaN) transistor, or IGBT. The gate impedance path may include a first path comprising an on resistor and a second path in parallel with the first path. The second path may include an off resistor in series with a diode. The capacitor may be charged during an on-state of the circuit based on the use of the clamping circuit. The series capacitor blocks some DC voltage by acting as a voltage divider with the FET Gate-Source capacitance. This shifts the unipolar pulses to bipolar to create a positive $V_{gs}$ for turn on and negative $V_{gs}$ for turn off of the FET. The totem pole driver may include a unipolar driver, for example. A unipolar driver may include a Negative-Positive-Negative type (NPN) transistor or a Positive-Negative-Positive type (PNP) transistor or any other combination of switches, such as MOSFETs, to create the unipolar drive. The capacitor may be positioned between a power source and the gate impedance path. The clamping circuit may be positioned between the gate impedance path and the transistor gate. All combinations in this paragraph (including the removal or addition of steps or components) are contemplated in a manner that is consistent with the other portions of the detailed description.

The methods, systems, or apparatuses disclosed herein may be incorporated into electric vehicles or other devices. The methods, systems, or apparatuses disclosed herein may be incorporated into products, such as an on-board charger (OBC), DC-DC converter, or inverter, among other things. For example, OBC may include a circuit comprising a totem pole driver; a gate impedance path; a capacitor in series with the gate impedance path; and a clamping circuit. The clamping circuit may clamp voltage of a transistor gate. The clamping circuit may include a plurality of Zener diodes in back-to-back series arrangement (e.g., anti-series). All combinations in this paragraph and the previous paragraphs (including the removal or addition of steps or components) are contemplated in a manner that is consistent with the other portions of the detailed description.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for".

Those of skill in the art would appreciate that the various illustrative blocks, modules, elements, components, methods, and algorithms described herein may be implemented as hardware, electronic hardware, computer software, or combinations thereof. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. A circuit for power device driving comprising:
   a totem pole driver;
   a gate impedance path, wherein the totem pole driver is connected with the gate impedance path, wherein the gate impedance path comprises a first path comprising an On resistor and a second path in parallel with the first path, wherein the second path comprises an Off resistor positioned upstream of and in series with a diode, wherein the Off resistor is directly connected to a cathode of the diode;
   a capacitor in series with the gate impedance path;
   a clamping circuit, wherein the clamping circuit clamps voltage of a transistor gate and the clamping circuit comprises a plurality of Zener diodes in a back-to-back series arrangement; and
   the transistor gate.

2. The circuit of claim 1, wherein the clamping circuit is positioned between the totem pole driver and the gate impedance path.

3. The circuit of claim 1, wherein the clamping circuit is positioned between the gate impedance path and the transistor gate.

4. The circuit of claim 1, wherein the transistor gate comprises a silicon carbide (SiC) metal-oxide-semiconductor field-effect transistor (MOSFET) or n-channel MOSFET.

5. The circuit of claim 1, wherein the transistor gate comprises a gallium nitride (GaN) transistor or insulated-gate bipolar transistor (IGBT).

6. The circuit of claim 1, wherein the circuit is integrated into an electronic component of an electric vehicle, the electronic component comprising a direct current-direct current (DC-DC) converter.

7. The circuit of claim 1, wherein the capacitor charges during an on-state of the circuit.

8. The circuit of claim 1, wherein the circuit is integrated into an electronic component of an automobile.

9. The circuit of claim 1, wherein the capacitor is positioned between a power source and the gate impedance path.

10. The circuit of claim 1, wherein:
    the capacitor is positioned between a power source and the gate impedance path, and
    the clamping circuit is positioned between the gate impedance path and the transistor gate.

11. A circuit for power device driving comprising:
    a gate impedance path, wherein the gate impedance path comprises a first path comprising an On resistor and a second path in parallel with the first path, wherein the second path comprises an Off resistor positioned upstream of and in series with a diode, wherein the Off resistor is directly connected to a cathode of the diode;
    a capacitor in series with the gate impedance path;
    a clamping circuit, wherein the clamping circuit clamps voltage of a transistor gate and the clamping circuit comprises a plurality of Zener diodes in a back-to-back series arrangement; and
    the transistor gate.

12. The circuit of claim 11, wherein the clamping circuit creates a charging current for the capacitor during an on-state of the circuit.

13. The circuit of claim 11, wherein the clamping circuit is positioned between the gate impedance path and the transistor gate.

14. The circuit of claim 11, wherein the transistor gate comprises a silicon carbide (SiC) metal-oxide semiconductor field-effect transistor (MOSFET).

15. The circuit of claim 11, wherein the transistor gate comprises a gallium nitride (GaN) transistor.

16. The circuit of claim 11, wherein the circuit is integrated into an electronic component of an electric vehicle, the electronic component comprising an on-board charger (OBC).

17. The circuit of claim 11, wherein the circuit is integrated into an electronic component of an electric vehicle.

18. The circuit of claim 11, wherein the circuit is integrated into an electronic component of an electric vehicle, the electronic component comprising an electronic inverter.

19. The circuit of claim 11, wherein the capacitor is positioned between a power source and the gate impedance path.

20. The circuit of claim 11, wherein:
    the capacitor is positioned between a power source and the gate impedance path, and
    the clamping circuit is positioned between the gate impedance path and the transistor gate.

* * * * *

UNITED STATES PATENT AND TRADEMARK OFFICE
CERTIFICATE OF CORRECTION

PATENT NO. : 12,388,434 B2
APPLICATION NO. : 18/121528
DATED : August 12, 2025
INVENTOR(S) : Yuxiang Shi et al.

Page 1 of 1

It is certified that error appears in the above-identified patent and that said Letters Patent is hereby corrected as shown below:

In the Claims

Column 8; Line Nos. 35-36 (Claim 14):
Replace "metal-oxide semiconductor field-effect" with --metal-oxide-semiconductor field-effect--.

Signed and Sealed this
Eleventh Day of November, 2025

John A. Squires
*Director of the United States Patent and Trademark Office*